United States Patent
Chen et al.

(10) Patent No.: US 8,623,575 B2
(45) Date of Patent: Jan. 7, 2014

(54) LIQUID CRYSTAL DISPLAY PANEL, COLOR FILTER AND MANUFACTURING METHOD THEREOF

(75) Inventors: Hsiao Hsien Chen, Shenzhen (CN); Kuan-Cheng Lee, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 202 days.

(21) Appl. No.: 13/379,648

(22) PCT Filed: Sep. 5, 2011

(86) PCT No.: PCT/CN2011/079312
§ 371 (c)(1),
(2), (4) Date: Dec. 20, 2011

(87) PCT Pub. No.: WO2012/171275
PCT Pub. Date: Dec. 20, 2012

(65) Prior Publication Data
US 2012/0320319 A1    Dec. 20, 2012

(30) Foreign Application Priority Data

Jun. 17, 2011 (CN) .......................... 2011 1 0169128

(51) Int. Cl.
*G02B 5/20* (2006.01)
*G02F 1/1335* (2006.01)

(52) U.S. Cl.
USPC .............................................. 430/7; 349/106

(58) Field of Classification Search
None
See application file for complete search history.

(56) References Cited

U.S. PATENT DOCUMENTS 5,365,357 A * 11/1994 Ohgawara et al. ............ 349/111
5,568,293 A * 10/1996 Takao et al. ................... 349/106

FOREIGN PATENT DOCUMENTS

JP          7-198924 A    *    8/1995

OTHER PUBLICATIONS

Computer-generated transaltion of JP 7-198924 (Aug. 1995).*

* cited by examiner

*Primary Examiner* — John A. McPherson
(74) *Attorney, Agent, or Firm* — Cheng-Ju Chiang

(57) ABSTRACT

A liquid crystal display (LCD) panel, a color filter (CF) and a manufacturing method thereof are disclosed in the present disclosure. The CF comprises a transparent substrate, a black matrix, first CF units, second CF units and a conductive layer. The transparent substrate comprises an active area and a dummy area. The first CF units in the active area have a trapezoidal cross section, and the second CF units in the dummy area have an inverted trapezoidal cross section. The conductive layer covers the active area continuously but covers the dummy area discontinuously; and thus, the active area can perform normal electrical conduction functions while an insulating effect can be achieved in the dummy area. In this way, even if conductive particles are present in the dummy area during the assembling process of the CF and a TFT, the discontinuous conductive layer in the dummy area can still prevent occurrence of abnormal conditions that the CF and the TFT are at the same voltage level. Thereby, abnormal short-circuits occurring when the CF and the TFT are assembled together can be prevented to improve the product quality.

18 Claims, 6 Drawing Sheets

US 8,623,575 B2

LIQUID CRYSTAL DISPLAY PANEL, COLOR FILTER AND MANUFACTURING METHOD THEREOF

FIELD OF THE INVENTION

The present disclosure generally relates to the technical field of electronic displays, and more particularly, to a liquid crystal display (LCD) panel, a color filter and a manufacturing method thereof.

BACKGROUND OF THE INVENTION

In LCDs that are widely used, color filtering regions of the three primary colors (red, green and blue; RGB) are arranged in a predetermined pattern to form color filter units.

Referring to FIG. 1, in a TFT-LCD, a color filter (CF) comprises a CF active area 101 and a CF dummy area 102. Correspondingly, referring to FIG. 2, a TFT array comprises a TFT active area 103, a TFT dummy area 104 and curing pads 105.

Referring to FIG. 3, there is shown a schematic view illustrating a spacing region between the CF and the TFT array after being assembled together. In this figure, the reference numeral 106 represents a CF substrate, the reference numeral 107 represents a CF indium tin oxide (ITO) layer, the reference numeral 108 represents a TFT array substrate, the reference numeral 109 represents a TFT first layer (TFT M1), the reference numeral 110 represents a TFT insulation layer, the reference numeral 111 represents a TFT second layer (TFT M2), the reference numeral 112 represents a TFT through-hole, the reference numeral 113 represents a TFT ITO layer, and the reference numeral 114 represents conductive particles.

The present inventor has found through long-term research and development that, if conductive particles 114 are present above the TFT through-holes 112, the TFT ITO layer 113 and the CF ITO layer 107 might be electrically connected to each other to cause an abnormal condition that the CF is at the same voltage level as the TFT; or if conductive particles 114 of large particle sizes are present in regions where no TFT through-hole 112 is formed, then such conductive particles 114 might penetrate through the TFT insulation layer 110 to reach the TFT M2 111 and then connect with the CF ITO layer 107 during the assembling process, which may also lead to the abnormal condition that the CF is at the same voltage level as the TFT.

SUMMARY OF THE INVENTION

A primary objective of the present disclosure is to provide an LCD panel, a color filter (CF) and a manufacturing method thereof, which can effectively avoid the abnormal condition that the CF is at the same voltage level as the TFT due to presence of conductive particles.

To achieve the aforesaid objective, the present disclosure provides a manufacturing method for a CF, which comprises the following steps of:

applying a light-shielding coating on a transparent substrate having an active area and a dummy area, exposing the light-shielding coating, and developing the light-shielding coating to remove all the light-shielding coating from the dummy area and obtain a black matrix in the active area;

applying a color filtering coating on the transparent substrate as a whole, illuminating the active area of the transparent substrate with ultraviolet (UV) light at a first intensity, illuminating the dummy area of the transparent substrate with UV light at a second intensity smaller than the first intensity, and developing the color filtering coating to obtain first CF units having a trapezoidal cross section in the active area and a plurality of second CF units having an inverted trapezoidal cross section in the dummy area, wherein the first CF units cover at least a portion of the black matrix, and adjacent ones of the second CF units are spaced apart from each other; and a length of a side of the trapezoidal cross section that is near the transparent substrate is longer than a length of a side of the trapezoidal cross section that is away from the transparent substrate, and a length of a side of the inverted trapezoidal cross section that is near the transparent substrate is shorter than a length of a side of the inverted trapezoidal cross section that is away from the transparent substrate; and plating a conductive layer on the transparent substrate as a whole, wherein the conductive layer covers the active area continuously but covers the dummy area discontinuously.

Preferably, in the step of developing the color filtering coating to obtain first CF units having a trapezoidal cross section in the active area and a plurality of second CF units having an inverted trapezoidal cross section in the dummy area, the first CF units include first red CF units, first green CF units and first blue CF units, and the second CF units include second red CF units, second green CF units and second blue CF units.

Preferably, the step of developing the color filtering coating to obtain first red CF units having a trapezoidal cross section in the active area and a plurality of second red CF units having an inverted trapezoidal cross section in the dummy area comprises:

applying a red color filtering coating on the transparent substrate;

through a graytone light-shielding sheet, illuminating the active area with UV light at the first intensity of 100% and illuminating the dummy area with UV light at the second intensity of 30%~50%; and removing unnecessary portions of the red color filtering coating through development so as to obtain the first red CF units having a trapezoidal cross section in the active area and the second red CF units having an inverted trapezoidal cross section in the dummy area.

Preferably, the step of developing the color filtering coating to obtain first green CF units having a trapezoidal cross section in the active area and a plurality of second green CF units having an inverted trapezoidal cross section in the dummy area comprises:

applying a green color filtering coating on the transparent substrate as a whole;

through a graytone light-shielding sheet, illuminating the active area with UV light at the first intensity of 100% and illuminating the dummy area with UV light at the second intensity of 30%~50%; and removing unnecessary portions of the green color filtering coating through development so as to obtain the first green CF units having a trapezoidal cross section in the active area and the second green CF units having an inverted trapezoidal cross section in the dummy area.

Preferably, the step of developing the color filtering coating to obtain first blue CF units having a trapezoidal cross section in the active area and a plurality of second blue CF units having an inverted trapezoidal cross section in the dummy area comprises:

applying a blue color filtering coating on the transparent substrate as a whole;

through a graytone light-shielding sheet, illuminating the active area with UV light at the first intensity of 100% and illuminating the dummy area with UV light at the second intensity of 30%~50%; and removing unnecessary portions of the blue color filtering coating through development so as to obtain the first blue CF units having a trapezoidal cross section in the active area and the second blue CF units having an inverted trapezoidal cross section in the dummy area.

To achieve the aforesaid objective, the present disclosure further provides a manufacturing method for a CF, which comprises the following steps of:

applying a light-shielding coating on a transparent substrate having an active area and a dummy area, and exposing and developing the light-shielding coating to obtain a black matrix in the active area;

applying a color filtering coating on the transparent substrate as a whole, illuminating the active area of the transparent substrate with UV light at a first intensity, illuminating the dummy area of the transparent substrate with UV light at a second intensity smaller than the first intensity, and developing the color filtering coating to obtain first CF units having a trapezoidal cross section at locations in the active area that correspond to light transmissive regions of the black matrix and a plurality of second CF units having an inverted trapezoidal cross section in the dummy area, wherein adjacent ones of the second CF units are spaced apart from each other; and a length of a side of the trapezoidal cross section that is near the transparent substrate is longer than a length of a side of the trapezoidal cross section that is away from the transparent substrate, and a length of a side of the inverted trapezoidal cross section that is near the transparent substrate is shorter than a length of a side of the inverted trapezoidal cross section that is away from the transparent substrate; and plating a conductive layer on the transparent substrate as a whole, wherein the conductive layer covers the active area continuously but covers the dummy area discontinuously.

Preferably, the step of exposing and developing the light-shielding coating to obtain a black matrix in the active area comprises: exposing the light-shielding coating, and developing the light-shielding coating to remove all the light-shielding coating from the dummy area and obtain the black matrix in the active area.

Preferably, the step of developing the color filtering coating to obtain first CF units having a trapezoidal cross section in the active area comprises developing the color filtering coating to obtain first CF units having a trapezoidal cross section in the active area, wherein the first CF units cover at least a portion of the black matrix.

Preferably, in the step of developing the color filtering coating to obtain first CF units having a trapezoidal cross section at locations in the active area that correspond to light transmissive regions of the black matrix and a plurality of second CF units having an inverted trapezoidal cross section in the dummy area, the first CF units include first red CF units, first green CF units and first blue CF units, and the second CF units include second red CF units, second green CF units and second blue CF units.

Preferably, the step of developing the color filtering coating to obtain first red CF units having a trapezoidal cross section at locations in the active area that correspond to light transmissive regions of the black matrix and a plurality of second red CF units having an inverted trapezoidal cross section in the dummy area comprises:

applying a red color filtering coating on the transparent substrate;

through a graytone light-shielding sheet, illuminating the active area with UV light at the first intensity of 100% and illuminating the dummy area with UV light at the second intensity of 30%~50%; and removing unnecessary portions of the red color filtering coating through development so as to obtain the first red CF units having a trapezoidal cross section in the active area and the second red CF units having an inverted trapezoidal cross section in the dummy area.

Preferably, the step of developing the color filtering coating to obtain first green CF units having a trapezoidal cross section at locations in the active area that correspond to light transmissive regions of the black matrix and a plurality of second green CF units having an inverted trapezoidal cross section in the dummy area comprises:

applying a green color filtering coating on the transparent substrate as a whole;

through a graytone light-shielding sheet, illuminating the active area with UV light at the first intensity of 100% and illuminating the dummy area with UV light at the second intensity of 30%~50%; and removing unnecessary portions of the green color filtering coating through development so as to obtain the first green CF units having a trapezoidal cross section in the active area and the second green CF units having an inverted trapezoidal cross section in the dummy area.

Preferably, the step of developing the color filtering coating to obtain first blue CF units having a trapezoidal cross section at locations in the active area that correspond to light transmissive regions of the black matrix and a plurality of second blue CF units having an inverted trapezoidal cross section in the dummy area comprises:

applying a blue color filtering coating on the transparent substrate as a whole;

through a graytone light-shielding sheet, illuminating the active area with UV light at the first intensity of 100% and illuminating the dummy area with UV light at the second intensity of 30%~50%; and removing unnecessary portions of the blue color filtering coating through development so as to obtain the first blue CF units having a trapezoidal cross section in the active area and the second blue CF units having an inverted trapezoidal cross section in the dummy area.

To achieve the aforesaid objective, the present disclosure further provides a color filter (CF), which comprises: a transparent substrate having an active area and a dummy area, a black matrix disposed on the active area of the transparent substrate, first CF units disposed at locations corresponding to light transmissive regions of the black matrix, a plurality of second CF units disposed on the dummy area of the transparent substrate and spaced apart from each other, and a conductive layer covering the black matrix, the first CF units and the second CF units. The conductive layer is continuous on the first CF units and the black matrix, and is discontinuous between adjacent ones of the second CF units. The first CF units have a trapezoidal cross section, and a length of a side of the trapezoidal cross section that is near the transparent substrate is longer than a length of a side of the trapezoidal cross section that is away from the transparent substrate. The second CF units have an inverted trapezoidal cross section, and a length of a side of the inverted trapezoidal cross section that is near the transparent substrate is shorter than a length of a side of the inverted trapezoidal cross section that is away from the transparent substrate.

Preferably, the first CF units cover at least a portion of the black matrix.

Preferably, the first CF units include first red CF units, first green CF units and first blue CF units, and the second CF units include second red CF units, second green CF units and second blue CF units.

To achieve the aforesaid objective, the present disclosure further provides a liquid crystal display (LCD) panel, which comprises a CF. The CF comprises: a transparent substrate having an active area and a dummy area, a black matrix disposed on the active area of the transparent substrate, first CF units disposed at locations corresponding to light transmissive regions of the black matrix, a plurality of second CF units disposed on the dummy area of the transparent substrate and spaced apart from each other, and a conductive layer covering the black matrix, the first CF units and the second CF units. The conductive layer is continuous on the first CF units and the black matrix, and is discontinuous between adjacent ones of the second CF units. The first CF units have a trapezoidal cross section, and a length of a side of the trapezoidal cross section that is near the transparent substrate is longer than a length of a side of the trapezoidal cross section that is away from the transparent substrate. The second CF units have an inverted trapezoidal cross section, and a length of a side of the inverted trapezoidal cross section that is near the transparent substrate is shorter than a length of a side of the inverted trapezoidal cross section that is away from the transparent substrate.

Preferably, the first CF units cover at least a portion of the black matrix.

Preferably, the first CF units include first red CF units, first green CF units and first blue CF units, and the second CF units include second red CF units, second green CF units and second blue CF units.

The present disclosure has the following benefits. In the prior art, the CF and the TFT might be at the same voltage level due to presence of conductive particles in the dummy area when the CF and the TFT are assembled together. In contrast, the present disclosure forms the CF units by illuminating the active area and the dummy area with UV light at different intensities through a graytone light-shielding sheet so that CF units having a trapezoidal cross section are obtained in the active area and CF units having an inverted trapezoidal cross section are obtained in the dummy area; and then during formation of the conductive layer, the conductive layer covering the CF units having the inverted trapezoidal cross section in the dummy area becomes discontinuous, thus providing an insulating effect. In this way, even if conductive particles are present in the dummy area during the assembling process of the CF and the TFT, the discontinuous conductive layer in the dummy area can still prevent occurrence of abnormal conditions that the CF and the TFT are at the same voltage level. Thereby, abnormal short-circuits occurring when the CF and the TFT are assembled together can be prevented to improve the product quality.

DETAILED DESCRIPTION OF THE INVENTION

Figure 1:
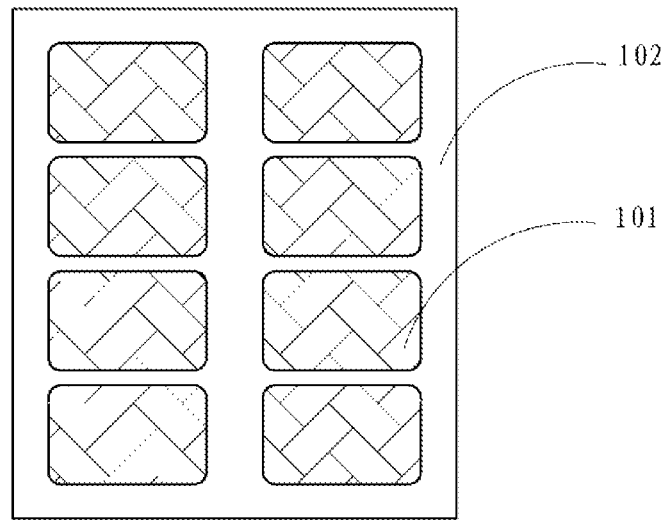
FIG. 1 is a schematic view illustrating a structure of a CF in the prior art.
Figure 2:
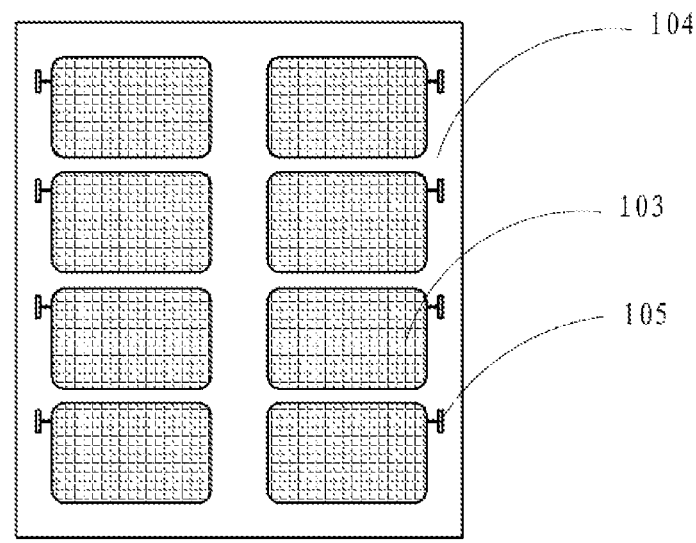
FIG. 2 is a schematic view illustrating a structure of a TFT array in the prior art.
Figure 3:
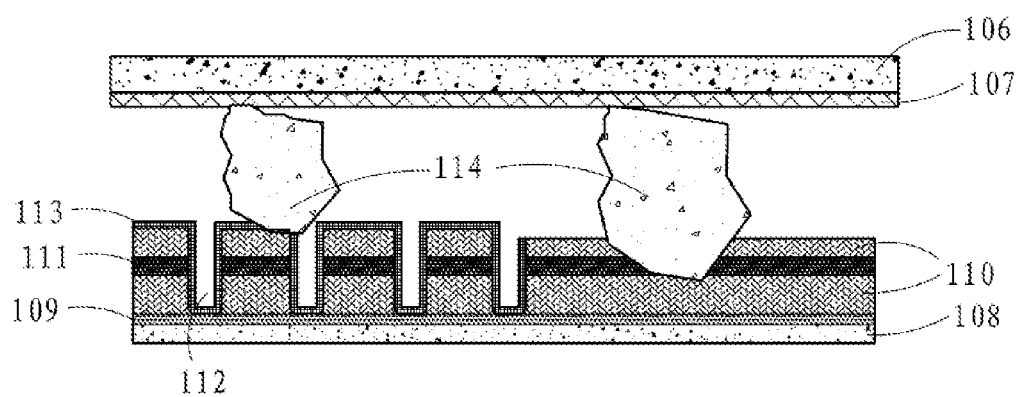
FIG. 3 is a schematic view illustrating a spacing region between the CF and the TFT array after being assembled together in the prior art.

Various embodiments of the disclosure are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

Figure 4:
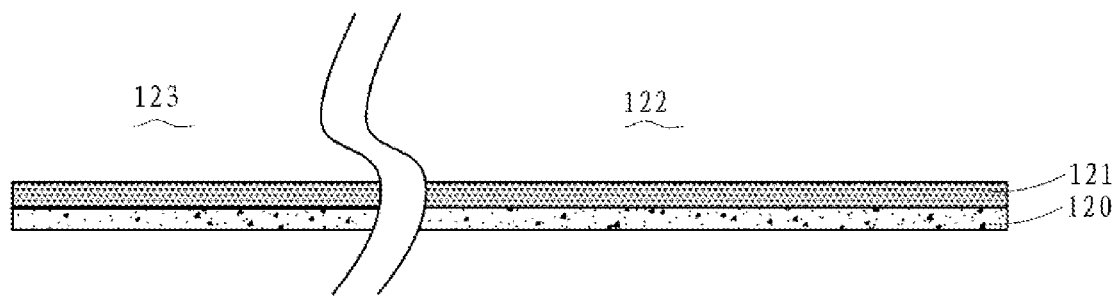
FIG. 4 is a schematic view illustrating a step of applying a light-shielding coating in an embodiment of a manufacturing method for a CF according to the present disclosure.
Figure 5:
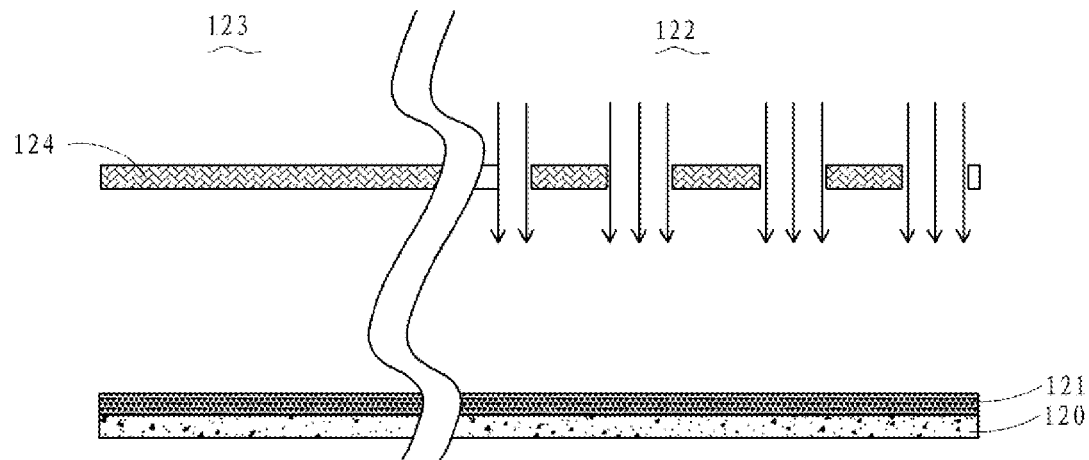
FIG. 5 is a schematic view illustrating a step of exposing the light-shielding coating in the embodiment of the manufacturing method for a CF according to the present disclosure.
Figure 6:
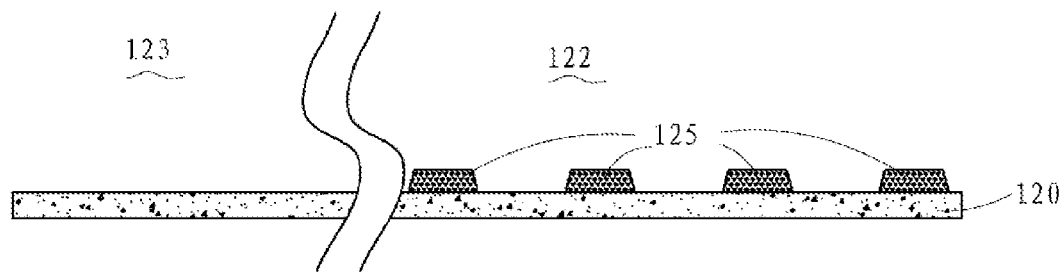
FIG. 6 is a schematic view illustrating a step of obtaining a black matrix in the embodiment of the manufacturing method for a CF according to the present disclosure.
Figure 7:
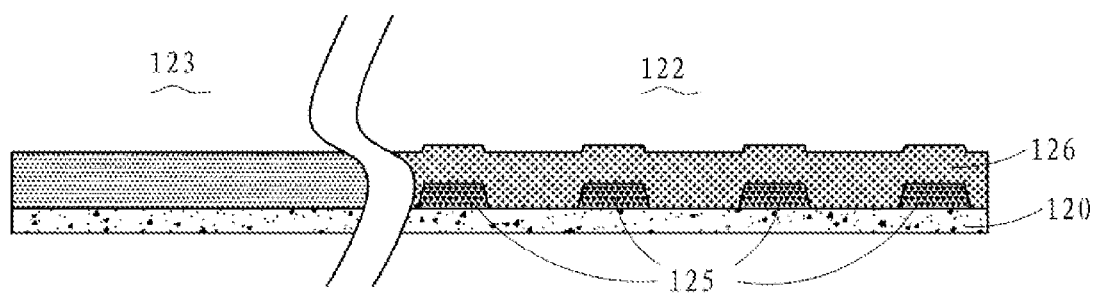
FIG. 7 is a schematic view illustrating a step of applying a color filtering coating in the embodiment of the manufacturing method for a CF according to the present disclosure.
Figure 8:
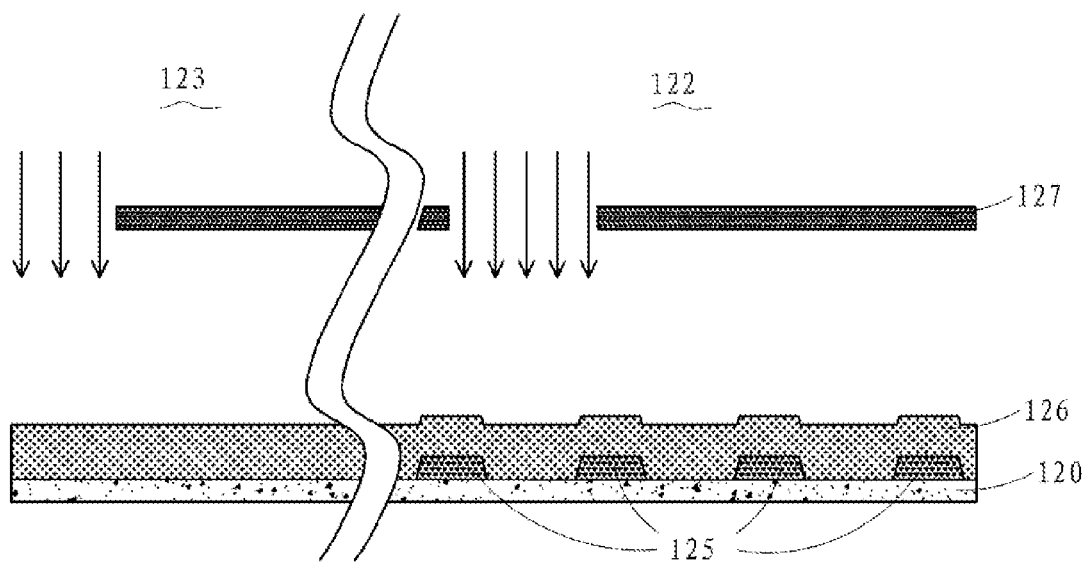
FIG. 8 is a schematic view illustrating a step of exposing the color filtering coating in the embodiment of the manufacturing method for a CF according to the present disclosure.
Figure 9:
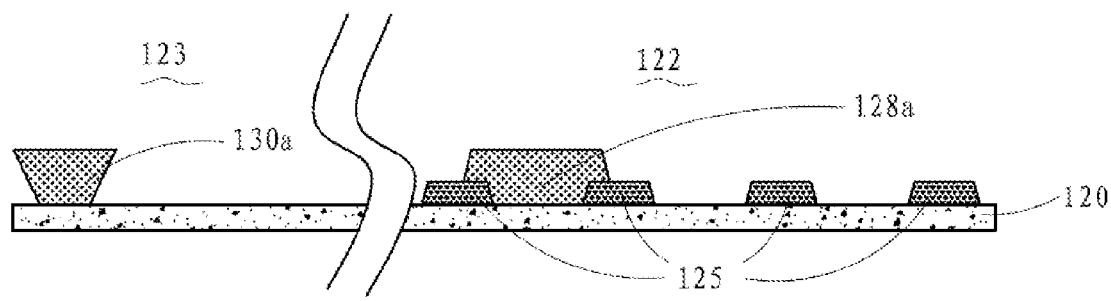
FIG. 9 is a schematic view illustrating a step of obtaining first red CF units and second red CF units in the embodiment of the manufacturing method for a CF according to the present disclosure.

Referring to FIG. 4 to FIG. 13, an embodiment of a manufacturing method for a color filter (CF) according to the present disclosure comprises the following steps of:

as shown in FIG. 4, applying a light-shielding coating 121 on a transparent substrate 120 comprising an active area 122 and a dummy area 123;

as shown in FIG. 5, exposing the light-shielding coating 121 on the transparent substrate 120 by means of a blacktone light-shielding sheet 124;

as shown in FIG. 6, developing the light-shielding coating 121 to remove unnecessary portions of the light-shielding coating 121 to obtain a black matrix 125, wherein the black matrix in the dummy area 123 is usually removed in a general design, so unnecessary portions of the light-shielding coating 121 are removed through development in this embodiment so as to obtain the black matrix 125 in the active area 122;

as shown in FIG. 7, applying a red color filtering coating 126 on the transparent substrate 120 covered with the black matrix 125;

as shown in FIG. 8, through a graytone light-shielding sheet 127, illuminating the red color filtering coating 126 in the active area 122 with ultraviolet (UV) light at an intensity of 100% and illuminating the red color filtering coating 126 in the dummy area 123 with UV light at an intensity of 30%~50%;

as shown in FIG. 9, removing unnecessary portions of the red color filtering coating 126 through development so as to obtain first red CF units 128a having a trapezoidal cross section in the active area 122 and second red CF units 130a having an inverted trapezoidal cross section in the dummy area 123, wherein a length of a side of the trapezoidal cross section that is near the transparent substrate 120 is longer than a length of a side of the trapezoidal cross section that is away from the transparent substrate 120, and a length of a side of the inverted trapezoidal cross section that is near the transparent substrate 120 is shorter than a length of a side of the inverted trapezoidal cross section that is away from the transparent substrate 120; and repeating the steps shown in FIG. 7 to FIG. 9 only with the color filtering coating to be applied being changed in color; i.e., applying a green color filtering coating to obtain first green CF units 128b having a trapezoidal cross section in the active area 122 and second green CF units 130b having an inverted trapezoidal cross section in the dummy area 123, and applying a blue color filtering coating to obtain first blue CF units 128c having a trapezoidal cross section in the active area 122 and second blue CF units 130c having an inverted trapezoidal cross section in the dummy area 123.

Figure 10:
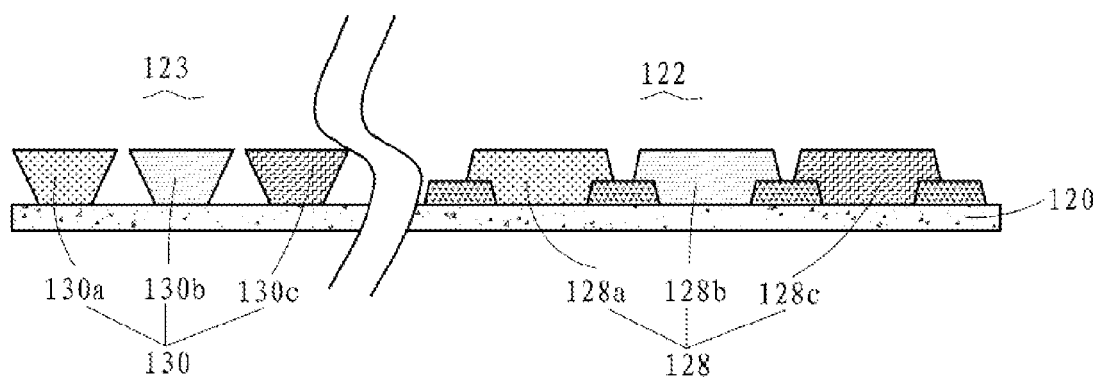
FIG. 10 is a schematic view illustrating a step of obtaining red CF units, green CF units and blue CF units in the embodiment of the manufacturing method for a CF according to the present disclosure.

As shown in FIG. 10, through the aforesaid three times of exposure and development, the first red CF units 128a, the first green CF units 128b and the first blue CF units 128c having a trapezoidal cross section, as well as the second red CF units 130a, the second green CF units 130b and the second blue CF units 130c having an inverted trapezoidal cross section are obtained.

Figure 11:
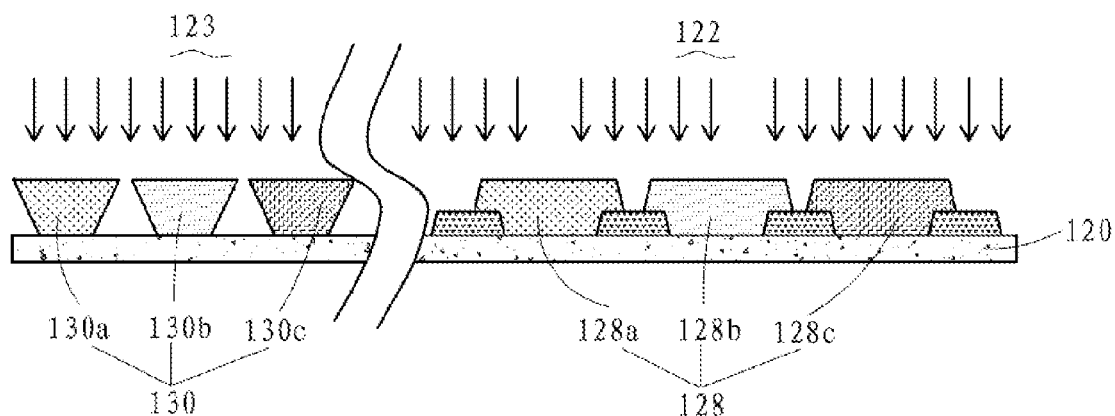
FIG. 11 is a schematic view illustrating a step of plating a conductive layer in the embodiment of the manufacturing method for a CF according to the present disclosure.
Figure 12:
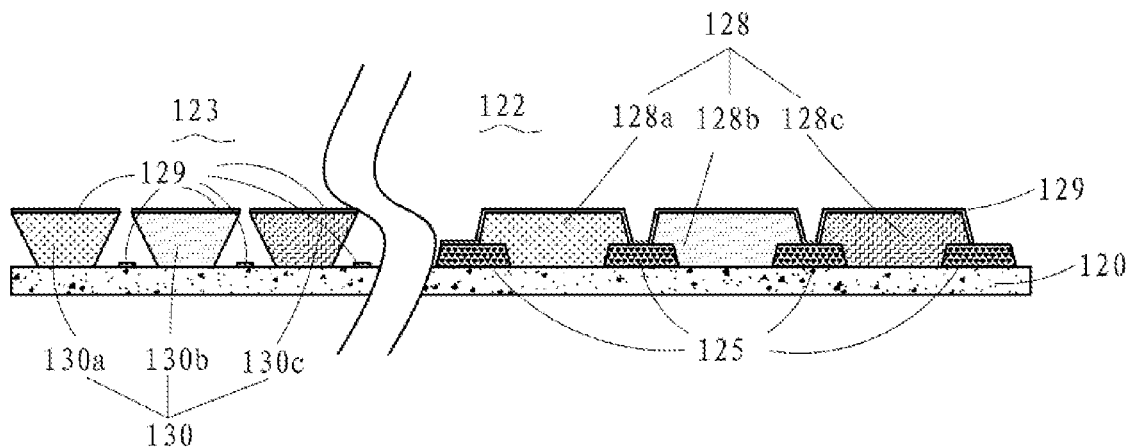
FIG. 12 is a schematic view illustrating a CF covered with the conductive layer in the embodiment of the manufacturing method for a CF according to the present disclosure.

Referring to FIG. 11 and FIG. 12, a conductive layer 129 is plated on the first red CF units 128a, the first green CF units 128b and the first blue CF units 128c, the black matrix 125, as well as the second red CF units 130a, the second green CF units 130b and the second blue CF units 130c having an inverted trapezoidal cross section.

The aforesaid "intensity of 100%" means that the color filtering coating can be just fully illuminated by UV light at this intensity so that both the surface and the interior of the color filtering coating are just solidified, thereby obtaining the CF units having a trapezoidal cross section through development. The "intensity of 30%~50%" means that the color filtering coating cannot be fully illuminated by UV light at this intensity so that the bottom layer of the color filtering coating is only partially illuminated by the UV light, thereby obtaining the CF units having an inverted trapezoidal cross section through development.

The principle for the color filtering coating 126 in the active area 122 and the color filtering coating 126 in the dummy area 123 to generate the CF units having different shapes when being illuminated by the UV light at different intensities is as follows: when light waves are projected onto a photoresist surface, the surface layer will firstly absorb the optical energy of individual wavelengths for reaction and, once the reaction is completed, the surface layer will not absorb the energy further; and only until then can the bottom layer have opportunity to absorb the remaining energy for reaction. Thereby, the projected optical energy can be controlled according to this principle in such a way that the surface layer is cross-linked completely and the bottom layer is cross-linked incompletely so as to control the shapes of the CF units.

As can be known from the above descriptions, in the prior art, the CF and the TFT array might be at the same voltage level due to presence of conductive particles in the dummy area when the CF and the TFT array are assembled together. In contrast, the present disclosure forms the CF units by illuminating the active area 122 and the dummy area 123 with UV light at different intensities through a graytone light-shielding sheet 127 so that first CF units 128 having a trapezoidal cross section are obtained in the active area 122 and second CF units 130 having an inverted trapezoidal cross section are obtained in the dummy area 123; and then during formation of the conductive layer 129, the conductive layer 129 covering the second CF units 130 having the inverted trapezoidal cross section in the dummy area 123 becomes discontinuous, thus providing an insulating effect. In this way, even if conductive particles are present in the dummy area 123 during the assembling process of the CF and the TFT array, the discontinuous conductive layer 129 in the dummy area 123 can still prevent occurrence of abnormal conditions that the CF and the TFT array are at the same voltage level. Thereby, abnormal short-circuits occurring when the CF and the TFT array are assembled together can be prevented to improve the product quality.

The black matrix 125 is made of an organic photoresist or a carbon black resin.

The conductive layer 129 is generally a transparent conductive layer made of indium tin oxide (ITO).

Referring to FIG. 12, an embodiment of a CF according to the present disclosure comprises: a transparent substrate 120, a black matrix 125, a plurality of first CF units 128, a plurality of second CF units 130 and a conductive layer 129. The transparent substrate 120 comprises an active area 122 and a dummy area 123. The black matrix 125 in the form of a grid is disposed on the active area 122 of the transparent substrate 120. The first CF units 128 are disposed in the grid of the black matrix 125. The first CF units 128 have a trapezoidal cross section, and a length of a side of the trapezoidal cross section that is near the transparent substrate 120 is longer than a length of a side of the trapezoidal cross section that is away from the transparent substrate 120. The second CF units 130 are disposed on the dummy area 123 of the transparent substrate 120. The second CF units 130 have an inverted trapezoidal cross section, and a length of a side of the inverted trapezoidal cross section that is near the transparent substrate 120 is shorter than a length of a side of the inverted trapezoidal cross section that is away from the transparent substrate 120. The conductive layer 129 covers the black matrix 125, the first CF units 128 and the second CF units 130. The conductive layer 129 is continuous on the first CF units 128 and the black matrix 125, and is discontinuous between adjacent ones of the second CF units 130.

Referring still to FIG. 12, the first CF units 128 cover at least a portion of the black matrix 125. The first CF units 128 cover at least a portion of the black matrix 125 in order to prevent light leakage of the CF, which can improve the filtering quality of the CF.

Referring still to FIG. 12, the first CF units 128 include first red CF units 128a, first green CF units 128b and first blue CF units 128c; and the second CF units 130 include second red CF units 130a, second green CF units 130b and second blue CF units 130c. Of course, although the red CF units, the green CF units and the blue CF units are used in combination in the present disclosure to obtain color filters of the red, green and blue (RGB) colors, combinations of CF units of other colors may also be adopted if other color filtering systems such as the CMYK color system are used depending on actual needs. Although this embodiment illustrates the CF units, but this is not to limit the scope of the present disclosure; and the CF units may also be replaced simply by color filters of other color filtering systems, which shall also fall within the scope of the present disclosure.

In the aforesaid embodiment, the black matrix 125 may be made of an organic photoresist or a carbon black resin; however, the present disclosure is not limited thereto in other embodiments.

In the aforesaid embodiment, the conductive layer 129 may be a transparent conductive layer made of ITO; however, the present disclosure is not limited thereto in other embodiments.

Figure 13:
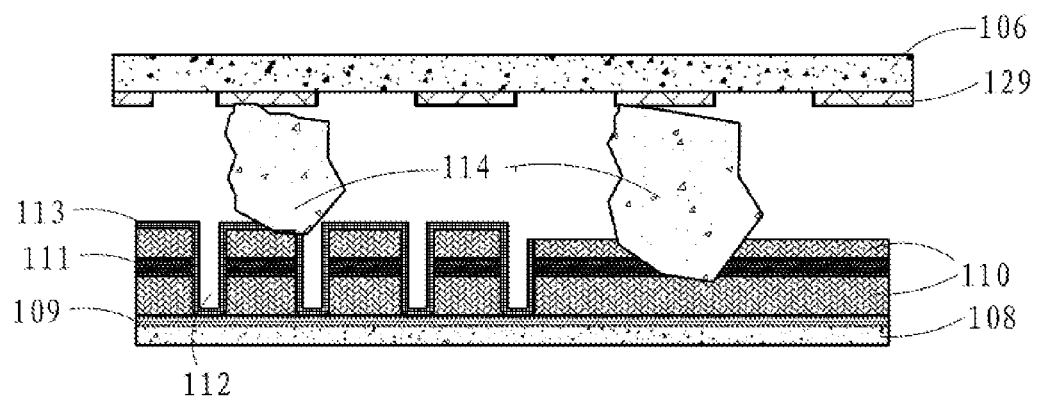
FIG. 13 is a schematic view illustrating a spacing region between the CF and a TFT after being assembled together according to the present disclosure.

Referring to FIG. 13, there is shown a schematic view illustrating a spacing region between the CF and a TFT array after being assembled together according to the present disclosure. In this figure, the reference numeral 106 represents a CF substrate, the reference numeral 129 represents a CF ITO layer, the reference numeral 108 represents a TFT substrate, the reference numeral 109 represents a TFT first layer (TFT M1), the reference numeral 110 represents a TFT insulation layer, the reference numeral 111 represents a TFT second layer (TFT M2), the reference numeral 112 represents a TFT through-hole, the reference numeral 113 represents a TFT ITO layer, and the reference numeral 114 represents conductive particles. The conductive layer 129 covering the dummy area in the present disclosure is discontinuous, thus providing an insulating effect. In this way, even if conductive particles are present in the dummy area during the assembling process of the CF and the TFT array, the discontinuous conductive layer 129 in the dummy area can still prevent occurrence of abnormal conditions that the CF and the TFT array are at the same voltage level. Thereby, abnormal short-circuits occurring when the CF and the TFT array are assembled together can be prevented to improve the product quality.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method for a color filter (CF), comprising the following steps of:
    applying a light-shielding coating on a transparent substrate having an active area and a dummy area, exposing the light-shielding coating, and developing the light-shielding coating to remove all the light-shielding coating from the dummy area and obtain a black matrix in the active area;
    applying a color filtering coating on the transparent substrate as a whole, illuminating the active area of the transparent substrate with ultraviolet (UV) light at a first intensity, illuminating the dummy area of the transparent substrate with UV light at a second intensity smaller than the first intensity, and developing the color filtering coating to obtain first CF units having a trapezoidal cross section in the active area and a plurality of second CF units having an inverted trapezoidal cross section in the dummy area, wherein the first CF units cover at least a portion of the black matrix, and adjacent ones of the second CF units are spaced apart from each other; and a length of a side of the trapezoidal cross section that is near the transparent substrate is longer than a length of a side of the trapezoidal cross section that is away from the transparent substrate, and a length of a side of the inverted trapezoidal cross section that is near the transparent substrate is shorter than a length of a side of the inverted trapezoidal cross section that is away from the transparent substrate; and
    plating a conductive layer on the transparent substrate as a whole, wherein the conductive layer covers the active area continuously but covers the dummy area discontinuously.

2. The manufacturing method for a CF of claim 1, wherein:
    in the step of developing the color filtering coating to obtain first CF units having a trapezoidal cross section in the active area and a plurality of second CF units having an inverted trapezoidal cross section in the dummy area, the first CF units include first red CF units, first green CF units and first blue CF units, and the second CF units include second red CF units, second green CF units and second blue CF units.

3. The manufacturing method for a CF of claim 2, wherein:
    the step of developing the color filtering coating to obtain first red CF units having a trapezoidal cross section in the active area and a plurality of second red CF units having an inverted trapezoidal cross section in the dummy area comprises:
    applying a red color filtering coating on the transparent substrate;
    through a graytone light-shielding sheet, illuminating the active area with UV light at the first intensity of 100% and illuminating the dummy area with UV light at the second intensity of 30%~50%; and
    removing unnecessary portions of the red color filtering coating through development so as to obtain the first red CF units having a trapezoidal cross section in the active area and the second red CF units having an inverted trapezoidal cross section in the dummy area.

4. The manufacturing method for a CF of claim 2, wherein:
    the step of developing the color filtering coating to obtain first green CF units having a trapezoidal cross section in the active area and a plurality of second green CF units having an inverted trapezoidal cross section in the dummy area comprises:
    applying a green color filtering coating on the transparent substrate as a whole;
    through a graytone light-shielding sheet, illuminating the active area with UV light at the first intensity of 100% and illuminating the dummy area with UV light at the second intensity of 30%~50%; and
    removing unnecessary portions of the green color filtering coating through development so as to obtain the first green CF units having a trapezoidal cross section in the active area and the second green CF units having an inverted trapezoidal cross section in the dummy area.

5. The manufacturing method for a CF of claim 2, wherein:
    the step of developing the color filtering coating to obtain first blue CF units having a trapezoidal cross section in the active area and a plurality of second blue CF units having an inverted trapezoidal cross section in the dummy area comprises:
    applying a blue color filtering coating on the transparent substrate as a whole;
    through a graytone light-shielding sheet, illuminating the active area with UV light at the first intensity of 100% and illuminating the dummy area with UV light at the second intensity of 30%~50%; and
    removing unnecessary portions of the blue color filtering coating through development so as to obtain the first blue CF units having a trapezoidal cross section in the active area and the second blue CF units having an inverted trapezoidal cross section in the dummy area.

6. A manufacturing method for a color filter (CF), comprising the following steps of:
- applying a light-shielding coating on a transparent substrate having an active area and a dummy area, and exposing and developing the light-shielding coating to obtain a black matrix in the active area;
- applying a color filtering coating on the transparent substrate as a whole, illuminating the active area of the transparent substrate with ultraviolet (UV) light at a first intensity, illuminating the dummy area of the transparent substrate with UV light at a second intensity smaller than the first intensity, and developing the color filtering coating to obtain first CF units having a trapezoidal cross section at locations in the active area that correspond to light transmissive regions of the black matrix and a plurality of second CF units having an inverted trapezoidal cross section in the dummy area, wherein adjacent ones of the second CF units are spaced apart from each other; and a length of a side of the trapezoidal cross section that is near the transparent substrate is longer than a length of a side of the trapezoidal cross section that is away from the transparent substrate, and a length of a side of the inverted trapezoidal cross section that is near the transparent substrate is shorter than a length of a side of the inverted trapezoidal cross section that is away from the transparent substrate; and
- plating a conductive layer on the transparent substrate as a whole, wherein the conductive layer covers the active area continuously but covers the dummy area discontinuously.

7. The manufacturing method for a CF of claim 6, wherein:
the step of exposing and developing the light-shielding coating to obtain a black matrix in the active area comprises: exposing the light-shielding coating, and developing the light-shielding coating to remove all the light-shielding coating from the dummy area and obtain the black matrix in the active area.

8. The manufacturing method for a CF of claim 7, wherein:
the step of developing the color filtering coating to obtain first CF units having a trapezoidal cross section in the active area comprises: developing the color filtering coating to obtain first CF units having a trapezoidal cross section in the active area, wherein the first CF units cover at least a portion of the black matrix.

9. The manufacturing method for a CF of claim 8, wherein:
in the step of developing the color filtering coating to obtain first CF units having a trapezoidal cross section at locations in the active area that correspond to light transmissive regions of the black matrix and a plurality of second CF units having an inverted trapezoidal cross section in the dummy area, the first CF units include first red CF units, first green CF units and first blue CF units, and the second CF units include second red CF units, second green CF units and second blue CF units.

10. The manufacturing method for a CF of claim 9, wherein:
the step of developing the color filtering coating to obtain first red CF units having a trapezoidal cross section at locations in the active area that correspond to light transmissive regions of the black matrix and a plurality of second red CF units having an inverted trapezoidal cross section in the dummy area comprises:
- applying a red color filtering coating on the transparent substrate;
- through a graytone light-shielding sheet, illuminating the active area with UV light at the first intensity of 100% and illuminating the dummy area with UV light at the second intensity of 30%~50%; and
- removing unnecessary portions of the red color filtering coating through development so as to obtain the first red CF units having a trapezoidal cross section in the active area and the second red CF units having an inverted trapezoidal cross section in the dummy area.

11. The manufacturing method for a CF of claim 9, wherein:
the step of developing the color filtering coating to obtain first green CF units having a trapezoidal cross section at locations in the active area that correspond to light transmissive regions of the black matrix and a plurality of second green CF units having an inverted trapezoidal cross section in the dummy area comprises:
- applying a green color filtering coating on the transparent substrate as a whole;
- through a graytone light-shielding sheet, illuminating the active area with UV light at the first intensity of 100% and illuminating the dummy area with UV light at the second intensity of 30%~50%; and
- removing unnecessary portions of the green color filtering coating through development so as to obtain the first green CF units having a trapezoidal cross section in the active area and the second green CF units having an inverted trapezoidal cross section in the dummy area.

12. The manufacturing method for a CF of claim 9, wherein:
the step of developing the color filtering coating to obtain first blue CF units having a trapezoidal cross section at locations in the active area that correspond to light transmissive regions of the black matrix and a plurality of second blue CF units having an inverted trapezoidal cross section in the dummy area comprises:
- applying a blue color filtering coating on the transparent substrate as a whole;
- through a graytone light-shielding sheet, illuminating the active area with UV light at the first intensity of 100% and illuminating the dummy area with UV light at the second intensity of 30%~50%; and
- removing unnecessary portions of the blue color filtering coating through development so as to obtain the first blue CF units having a trapezoidal cross section in the active area and the second blue CF units having an inverted trapezoidal cross section in the dummy area.

13. A color filter (CF), comprising:
- a transparent substrate having an active area and a dummy area, a black matrix disposed on the active area of the transparent substrate, first CF units disposed at locations corresponding to light transmissive regions of the black matrix, a plurality of second CF units disposed on the dummy area of the transparent substrate and spaced apart from each other, and a conductive layer covering the black matrix, the first CF units and the second CF units;
- the conductive layer is continuous on the first CF units and the black matrix, and is discontinuous between adjacent ones of the second CF units;
- the first CF units have a trapezoidal cross section, and a length of a side of the trapezoidal cross section that is near the transparent substrate is longer than a length of a side of the trapezoidal cross section that is away from the transparent substrate; and
- the second CF units have an inverted trapezoidal cross section, and a length of a side of the inverted trapezoidal cross section that is near the transparent substrate is shorter than a length of a side of the inverted trapezoidal cross section that is away from the transparent substrate.

14. The CF of claim 13, wherein:
the first CF units cover at least a portion of the black matrix.

15. The CF of claim 14, wherein:
the first CF units include first red CF units, first green CF units and first blue CF units, and the second CF units include second red CF units, second green CF units and second blue CF units.

16. A liquid crystal display (LCD) panel, comprising a color filter (CF), wherein:
the CF comprises: a transparent substrate having an active area and a dummy area, a black matrix disposed on the active area of the transparent substrate, first CF units disposed at locations corresponding to light transmissive regions of the black matrix, a plurality of second CF units disposed on the dummy area of the transparent substrate and spaced apart from each other, and a conductive layer covering the black matrix, the first CF units and the second CF units;
the conductive layer is continuous on the first CF units and the black matrix, and is discontinuous between adjacent ones of the second CF units;
the first CF units have a trapezoidal cross section, and a length of a side of the trapezoidal cross section that is near the transparent substrate is longer than a length of a side of the trapezoidal cross section that is away from the transparent substrate; and
the second CF units have an inverted trapezoidal cross section, and a length of a side of the inverted trapezoidal cross section that is near the transparent substrate is shorter than a length of a side of the inverted trapezoidal cross section that is away from the transparent substrate.

17. The LCD panel of claim 16, wherein:
the first CF units cover at least a portion of the black matrix.

18. The LCD panel of claim 17, wherein:
the first CF units include first red CF units, first green CF units and first blue CF units, and the second CF units include second red CF units, second green CF units and second blue CF units.

* * * * *